(12) United States Patent
Kudo

(10) Patent No.: US 8,096,805 B2
(45) Date of Patent: Jan. 17, 2012

(54) MANUFACTURING APPARATUS FOR SEMICONDUCTOR DEVICE AND MANUFACTURING METHOD OF SEMICONDUCTOR DEVICE

(75) Inventor: Tomoyasu Kudo, Oita (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 544 days.

(21) Appl. No.: 11/944,830

(22) Filed: Nov. 26, 2007

(65) Prior Publication Data

US 2008/0124947 A1    May 29, 2008

(30) Foreign Application Priority Data

Nov. 27, 2006   (JP) ................ P2006-318385

(51) Int. Cl.
*F27B 9/02* (2006.01)
(52) U.S. Cl. ............... 432/128; 432/31; 118/724
(58) Field of Classification Search .............. 432/121, 432/128, 19, 24, 31; 118/724, 725, 50.1
See application file for complete search history.

(56) References Cited

U.S. PATENT DOCUMENTS

| | | | | |
|---|---|---|---|---|
| 4,518,848 | A  * | 5/1985  | Weber      | 219/388 |
| 6,461,438 | B1 * | 10/2002 | Ookura et al. | 118/724 |
| 6,464,789 | B1   | 10/2002 | Akimoto    | |
| 6,475,279 | B1 * | 11/2002 | Akimoto    | 118/52 |
| 6,503,003 | B2 * | 1/2003  | Hasebe et al. | 396/611 |
| 6,821,174 | B2 * | 11/2004 | Kaneko et al. | 445/6 |
| 6,875,283 | B2 * | 4/2005  | Nishibayashi | 118/725 |
| 6,881,058 | B2 * | 4/2005  | Kawano et al. | 432/152 |

FOREIGN PATENT DOCUMENTS

JP    2003-347198    12/2003

* cited by examiner

*Primary Examiner* — Gregory A Wilson
(74) *Attorney, Agent, or Firm* — Finnegan, Henderson, Farabow, Garrett & Dunner, L.L.P.

(57) ABSTRACT

A manufacturing apparatus for a semiconductor device that includes a bake chamber for a wafer with a coating film formed thereon to be baked at a predetermined temperature, a cooling chamber connected to the bake chamber, a first carrying unit for the baked wafer to be carried in the cooling chamber, a first temperature control unit for the wafer carried by the first carrying unit to be cooled down, and an unloading gate for unloading the wafer cooled down from the cooling chamber.

17 Claims, 3 Drawing Sheets

MANUFACTURING APPARATUS FOR SEMICONDUCTOR DEVICE AND MANUFACTURING METHOD OF SEMICONDUCTOR DEVICE

CROSS-REFERENCE TO RELATED APPLICATIONS

This application is based upon and claims the benefit of priority from the prior Japanese Patent Application No. 2006-318385 filed on Nov. 27, 2006, the entire contents of which are incorporated herein by reference.

BACKGROUND OF THE INVENTION

1. Field of the Invention

The present invention relates to a manufacturing apparatus for a semiconductor device and a manufacturing method of a semiconductor device for baking of a substrate on which a coating film such as an anti-reflective coating (ARC) film is formed.

2. Description of the Related Art

In general, a lithography technique is used in a process for forming a pattern on a surface of a semiconductor wafer, a liquid crystal display (LCD) glass substrate, or the like (hereinafter referred to as a "substrate"). Such a pattern formation process generally including a resist film formation step in which a resist is applied onto the surface of a substrate to form a resist film, an exposure step in which the formed resist film is exposed to radiation for pattern transfer, and a development step in which the resist film after exposure is subjected to development.

In recent years, higher-level microfabrication has been required as finer element. To meet the requirement, for example, a technique of forming an ARC film before forming a resist film is applied. By forming an ARC film, it is possible to suppress trailing of a resist film that is caused by reflection from a substrate. during exposure of the resist film. It is also possible to prevent a substrate from being contaminated by organic amine contained in a developer.

Such an ARC film is formed as follows. First, an ARC coating film is formed over the surface of a substrate by spin coating, etc. Then, the substrate is baked in a chamber or the like to promote crosslinking reaction for prevention of mixing with a resist and to improve adhesion to a substrate.

After baked, the substrate is unloaded from the chamber. When unloading the substrate, the substrate is abruptly cooled to room temperature. As a result, ARC-sublimates become dust on the substrate surface and in the chamber. Therefore, a problem arises that reduction in yield of a semiconductor device, etc. is caused.

Regarding the suppression of sublimates, for example, [claim 1], [0027], and other paragraphs of Japanese Patent Application Laid-open No. 2003-347198 describe that collection of sublimates is performed. Paragraph [0026] and so on of this patent publication describe that a substrate is cooled in a cooling arm 5, and then is unloaded.

However, although the cooling speed needs to be sufficiently decreased to suppress the dust caused by sublimates, there is a problem that the decreased speed directly affects the throughput with the foregoing technique.

SUMMARY OF THE INVENTION

According to an embodiment of the present invention, a manufacturing apparatus for a semiconductor device includes a bake chamber for a wafer with a coating film formed thereon to be baked at a predetermined temperature, and a cooling chamber connected to the bake chamber. The manufacturing apparatus further includes a first carrying unit for the baked wafer to be carried in the cooling chamber, a first temperature control mechanism for the wafer carried by the first carrying unit to be cooled down, and a gate for unloading the wafer cooled down from the cooling chamber.

According to an embodiment of the present invention, a manufacturing method of a semiconductor device includes baking a wafer having a coating film formed thereon at a predetermined temperature in a bake chamber. The manufacturing method also includes cooling down the baked wafer while carrying the wafer in a cooling chamber, and thereafter unloading the wafer from the cooling chamber.

It is to be understood that both the forgoing general description and the following detailed description are exemplary and explanatory only and are not restrictive of the invention, as claimed.

BRIEF DESCRIPTION OF THE DRAWINGS

The accompanying drawings, which is incorporated in and constitute a part of this specification, illustrates an embodiment of the invention and together with the description, serve to explain the principles of the invention.

DETAILED DESCRIPTION OF THE EMBODIMENTS

Figure 1:
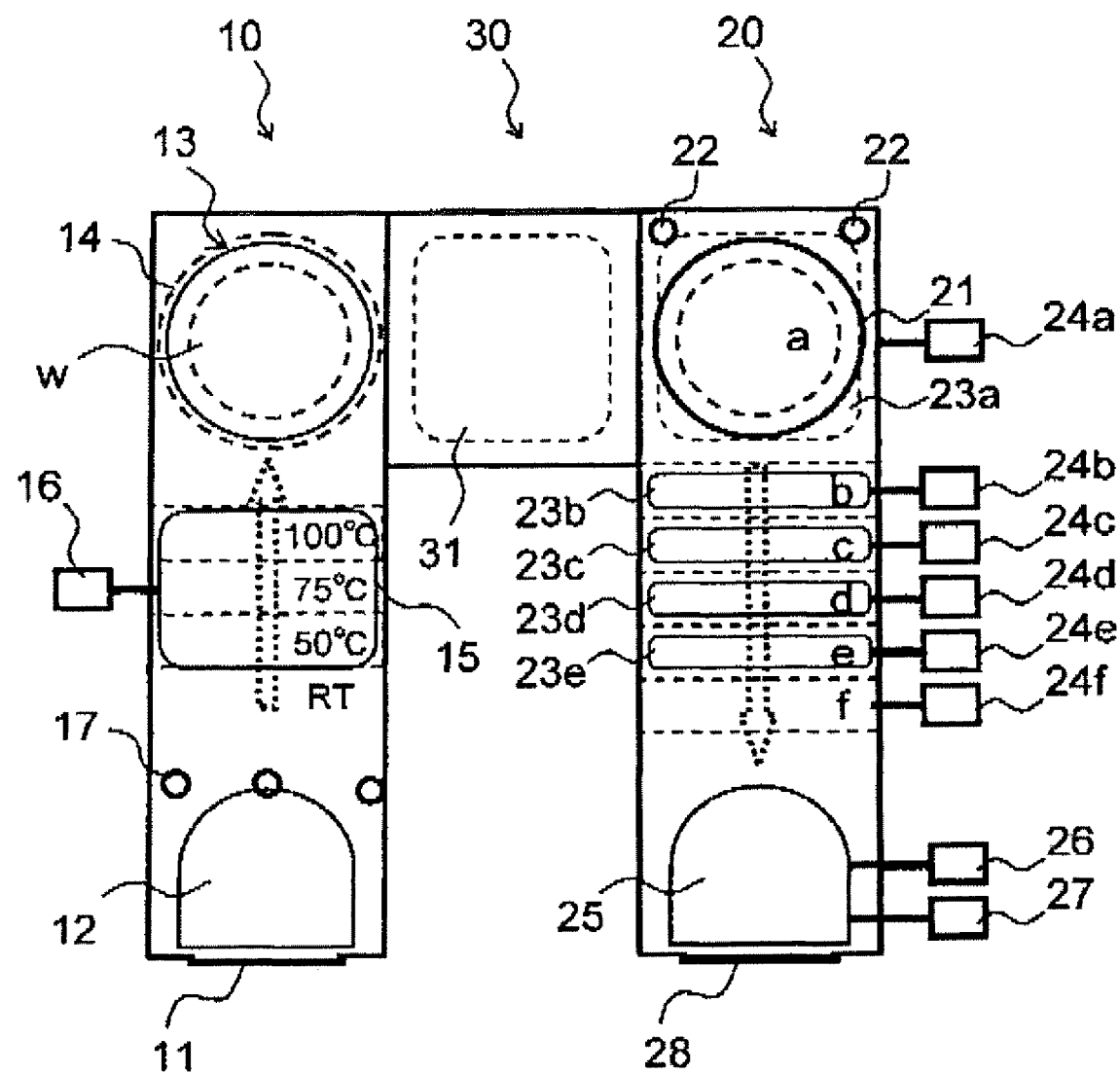
FIG. 1 is a conceptual top view illustrating the configuration of a manufacturing apparatus for a semiconductor device of an embodiment of the present invention.

Reference will now be made in detail to the present embodiment of the invention, an example of which is illustrated in the accompanying drawing. Wherever possible, the same reference numbers will be used throughout the drawing to refer to the same or like parts.

FIG. 1 is a conceptual top view illustrating the configuration of a semiconductor manufacturing apparatus of this embodiment of the invention. As illustrated in the figure, the manufacturing apparatus includes a bake chamber 10 for a wafer w having an ARC coating film formed thereon to be baked, a cooling chamber 20 for the wafer w to be cooled, and a connection unit 30 that connects the bake chamber 10 with the cooling chamber 20.

Located in the bake chamber 10 are a wafer loading gate 11 for loading the wafer w to the bake chamber 10, a carrying arm 12 for the wafer w to be carried, and a bake unit 13 including a heater for the wafer w to be baked. The bake unit 13 is provided with a chamber cover 14 for controlling the temperature ambient of the placed wafer w to be kept constant.

A heater 15 serving as heating means is disposed between the wafer loading gate 11 and the bake unit 13. The heater 15 is connected to a temperature controller 16 for controlling the temperature of the heater. Exhaust outlets 17 for exhausting gas containing exhausted gas from the bake unit 13 are provided in upper portion on the side of the wafer loading gate 11 of the bake chamber 10.

The connection unit 30 is connected to the bake chamber 10. A heater 31 for heating the wafer w is Located in the connection unit 30 to prevent the wafer w heated in the bake unit 13 from being rapidly cooled.

Connected to the connection unit 30 is the cooling chamber 20. A carrying arm 21 for carrying the wafer w is located in the cooling chamber 20, and exhaust outlets 22 are provided in upper portion of the chamber. A plurality of heaters 23a, 23b, 23c, 23d, and 23e arranged in parallel to one another are provided to heat the inside of the cooling chamber 20. Further, provided are temperature control units 24a, 24b, 24c, 24d, 24e, and 24f for each controlling the cooling chamber so that the cooling chamber has a predetermined temperature gradient.

Located in the cooling chamber 20 is a cool carrying plate 25 including a drive unit for a wafer to be placed and carried. The cooling and carrying plate 25 is provided with a temperature control unit 26 for controlling the temperature of the plate and a speed control unit 27 for controlling the carrying speed of the plate. Further, provided is a wafer unloading gate 28 for unloading the carried wafer w.

Using a semiconductor manufacturing apparatus as described above, an ARC film on a wafer is baked as follows. First, the wafer w on which an ARC coating film is formed is loaded to the bake chamber 10 by the wafer loading gate 11. The loaded wafer w is carried in the bake chamber 10 with the carrying arm 12. The heater 15 is controlled by the temperature controller 16 such that heating is done gradually, e.g., to a temperature of 215° C. By heating by the heater 15, the ambient temperature is controlled to have a temperature gradient, e.g., of room temperature (RT), 50° C., 75° C., and 100° C. in the order from the wafer loading gate 11. Then, the wafer is carried to the bake unit 13.

Figure 2:
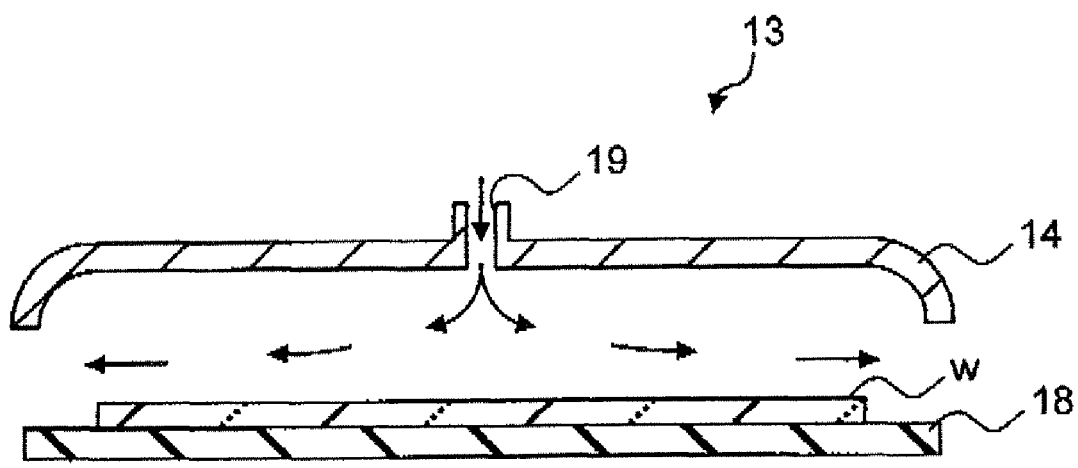
FIG. 2 is a sectional view illustrating a bake unit of the manufacturing apparatus for a semiconductor device of an embodiment of the present invention.

FIG. 2 is a sectional view illustrating the structure of the bake unit 13. As illustrated in the figure, provided are a bake board 18 for the wafer w to be placed and heated and the chamber cover 14 for keeping the heated wafer w in a constant atmosphere. Provided in an upper portion of the chamber cover 14 is an air supply inlet 19 for air purging an area formed by the chamber cover 34 and the bake board 18 in a predetermined atmosphere.

In such the bake unit 13, the carried wafer w is first placed on the bake board 18 heated at a temperature of about 215° C., and then is coated with the chamber cover 14. Air is supplied from the air supply inlet 19 to control the temperature such that the surface of the wafer w has a temperature of about 180° C. and the atmosphere in the area formed by the chamber cover 14 and bake board 18 has a temperature of about 100° C. The supplied air is exhausted from a clearance formed between the chamber cover 14 and the bake board 18 to the inside of the bake chamber 10. In this way, the wafer w is kept in a predetermined temperature, and thus is baked.

The wafer w baked in the bake unit 13 is carried using the carrying arm 21 to the cooling chamber 20 through the connection unit 30 heated at a bake temperature (e.g., 215° C.) by the heater 31.

The wafer w carried to the cooling chamber 20 is placed on the cooling and carrying plate 25, and is carried in the cooling chamber 20. When carrying in the cooling chamber 20, sublimates of the ARC coating film are exhausted from the exhaust outlets 22 disposed in the upper portion of the cooling chamber 20.

The wafer w is slowly moved from an area for which the heater 23a is controlled in advance to have the bake temperature (e.g., 215° C.) by the temperature control unit 24a through an area b for which the heater 23b is controlled to have a temperature of, e.g., 200° C. by the temperature control unit 24b, an area c for which the heater 23c is controlled to have a temperature of, e.g., 150° C. by the temperature control unit 24c, an area d for which the heater 23d is controlled to have a temperature of, e.g., 100° C. by the temperature control unit 24d, an area e for which the heater 23e is controlled to have a temperature of, e.g., 50° C. by the temperature control unit 24e, and an area f controlled to have a room temperature of, e.g., 25° C. by the temperature control mechanism 24f.

Concurrently with this, the temperature of the cooling and carrying plate 25 is gradually decreased by the temperature control mechanism 26. In addition, the cooling and carrying plate 25 is controlled by the speed control unit 27 to have speeds of, e.g., from 0.1 cm/s to 30 cm/s. The wafer w at a temperature reduced to a room temperature of 25° C. is carried out by the wafer unloading gate 28.

In this way, the wafer w on which the ARC coating film is formed is baked in the bake chamber 10, and then is cooled in the cooling chamber 20 such that the temperature of the wafer is gradually reduced. After the temperature reaches room temperature, the wafer w is unloaded by the wafer unloading gate 28. Therefore, it does not occur that ARC-sublimates become dust on the surface of the wafer and in the chamber because of abrupt temperature decrease after baking. This allows reduction in yield of a semiconductor wafer and a semiconductor device, etc. to be suppressed.

The baked wafer w is successively carried to the cooling chamber 20 without returning to the wafer loading gate 11. Therefore, reduction in yield of a semiconductor wafer and a semiconductor device due to dust formation caused by sublimates can be suppressed without reducing throughput.

The inside of the bake chamber 10 up to the bake unit 13 is heated, and therefore abrupt temperature reduction in the bake chamber 10 caused by entering outside air during carrying of the wafer w is suppressed. Accordingly, this allows solidification of ARC sublimates to be suppressed in the bake chamber 10. Further, this heating means 15 is controlled to have a temperature gradient. Accordingly, this allows temperature changes in the bake chamber 10 during carrying of the wafer w to be more suppressed.

Further, by using the exhaust outlets 17 provided in the upper portion on the side of the wafer loading gate 11 of the bake chamber 10, ARC sublimates are exhausted. Accordingly, this allows the diffusion of ARC sublimates caused by entering outside air to be suppressed.

Figure 3:
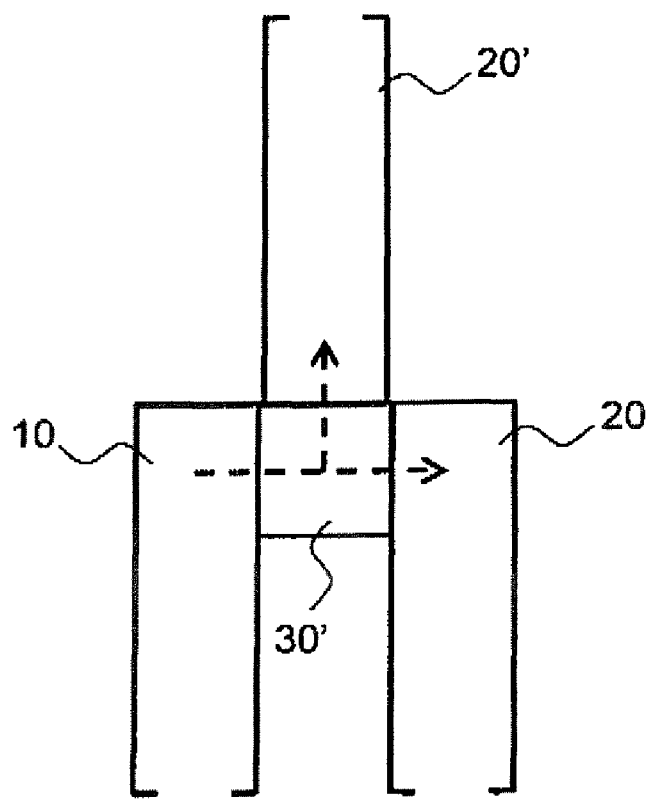
FIG. 3 illustrates the layout of a chamber of the manufacturing apparatus for a semiconductor device of an embodiment of the present invention.

Note that although one cooling chamber 20 is used in this embodiment, the cooling chamber may be branched into two or more cooling chambers 20 and 20' in a connection unit 30' connected with the bake chamber 10 as illustrated in the chamber layout of FIG. 3. Since the process of cooling becomes a rate-controlling process, providing a plurality of cooling chambers allows the throughput to be further improved.

The temperature needs only to be gradually reduced in the cooling chamber 20, and the measure for the reduction is not particularly limited. Although both the temperature of the cooling and carrying plate 25 for carrying and cooling the wafer w and the temperature of areas in the cooling chamber 20 in which the wafer w is carried are controlled in this embodiment, at least one of the temperatures need to be able to be controlled. However, if the temperature of the cooling and carrying plate 25 is not controlled, a material having good thermal conductivity such as an Al plate is preferably used, and the temperature control by a heater is preferably more precise. If the temperature of the cooling and carrying plate 25 is controlled, heaters that can heat the wafer such that the temperature of the wafer is lower than the bake temperature and higher than room temperature are preferably provided in at least one or more portions on the way of the cooling chamber 20.

Although the wafer w is preferably cooled to room temperature when being loaded, a temperature difference from room temperature is acceptable if the wafer w has such a temperature, e.g., in a range from a room temperature of 25°

C. to 150° C. as not to cause formation of sublimates when the wafer w is carried. The carrying speed of the cooling and carrying plate 25 needs only to be such a speed that the actual temperature of the wafer w follows the temperature of each area, and may be appropriately set and varied. For example, it is preferable that the carrying speed be relatively low, 30 cm/s or less. On the other hand, it is preferable from the viewpoint of improving the throughput that the carrying speed be 0.1 cm/s or more.

Figure 4:
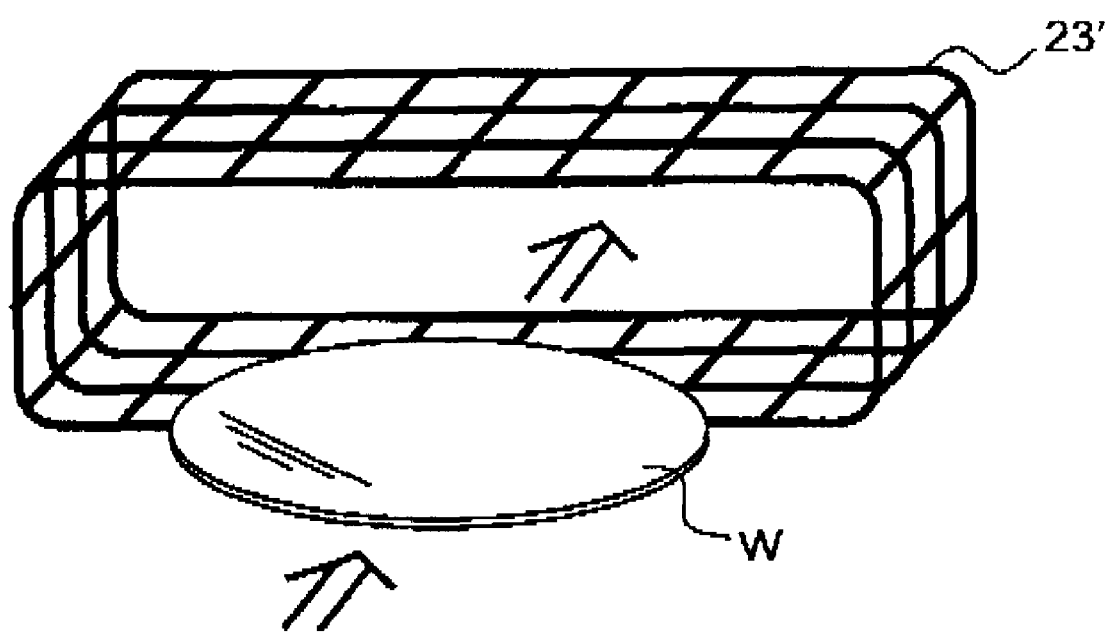
FIG. 4 is a perspective view illustrating the shape of a heater according to an embodiment of the present invention.

The heaters 23$a$, 23$b$, 23$c$, 23$d$, and 23$e$ are not particularly limited if they can be heated at temperatures from about 50 to 215° C. For example, a conventional electrical resistance heater and the like may be used. The placement positions are not particularly limited, but the heaters are preferably placed inside the cooling chamber 20 from the viewpoint of heating efficiency. The shape may be such that the wafer w is carried inside the lattice heater 23' as illustrated in the perspective view of FIG. 4. Ring-shaped heaters and convolute heaters may be placed in upper and lower portions. The same is true for the heater 15.

Although the bake process of an ARC coating film is described in this embodiment, the invention is not limited to ARC films. In the bake process of other organic coating films such as resist films, the constitution of the invention can be applied similarly. This is because sublimates are formed in both the films in different degrees.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A manufacturing apparatus for a semiconductor device, comprising:
    a bake chamber for a wafer with a coating film formed thereon to be baked at a predetermined temperature;
    a cooling chamber connected to the bake chamber;
    a first carrying unit for the baked wafer to be carried in the cooling chamber;
    a plurality of first temperature control units, each of the plurality of first temperature control units configured to control a temperature of each successive area in the cooling chamber in which the wafer carried by the first carrying unit is cooled down gradually;
    an unloading gate for unloading the wafer cooled down from the cooling chamber; and
    a second carrying unit, disposed between the bake chamber and the cooling chamber, for the wafer to be carried from the bake chamber to the cooling chamber,
    wherein one of the plurality of first temperature control units includes a first heating unit for an inside of the cooling chamber to be heated to have a temperature lower than the predetermined temperature and higher than room temperature.

2. The manufacturing apparatus for a semiconductor device according to claim 1, wherein the first heating unit is capable of heating at least an upper portion and a lower portion of the wafer.

3. The manufacturing apparatus for a semiconductor device according to claim 1, wherein the plurality of first temperature control units are controllable to have a temperature gradient in a direction of the wafer being carried.

4. The manufacturing apparatus for a semiconductor device according to claim 1, wherein an exhaust outlet is provided in the cooling chamber.

5. The manufacturing apparatus for a semiconductor device according to claim 1, wherein the bake chamber is connected to a plurality of cooling chambers.

6. The manufacturing apparatus for a semiconductor device according to claim 1, wherein the bake chamber includes:
    a loading gate for loading a wafer;
    a bake unit having a heater for the wafer to be heated at a predetermined temperature;
    a third carrying unit for the wafer to be carried in the bake chamber; and
    a second temperature control unit for the wafer carried by the third carrying unit to be heated.

7. The manufacturing apparatus for a semiconductor device according to claim 6, wherein an exhaust outlet is provided in the bake chamber.

8. The manufacturing apparatus for a semiconductor device according to claim 6, wherein the second temperature control unit is controllable to have a temperature gradient in a direction of the wafer being carried.

9. The manufacturing apparatus for a semiconductor device according to claim 6, wherein the second temperature control unit has a second heating unit capable of heating at least an upper portion and a lower portion of the wafer.

10. A manufacturing method of a semiconductor device, comprising:
    baking a wafer having a coating film formed thereon at a predetermined temperature in a bake chamber; and
    carrying the wafer through a plurality of successive areas in a cooling chamber and controlling a temperature of each successive area in the cooling chamber separately so that the wafer is cooled down gradually, and thereafter unloading the wafer from the cooling chamber, wherein an inside of the cooling chamber is heated to have a temperature lower than the predetermined temperature and higher than room temperature.

11. The manufacturing method of a semiconductor device according to claim 10, wherein at least an upper portion and a lower portion of the wafer are heated.

12. The manufacturing method of a semiconductor device according to claim 10, wherein an inside of the cooling chamber is controlled to have a temperature gradient in a direction of the carrying.

13. The manufacturing method of a semiconductor device according to claim 10, wherein exhaust gas is exhausted from the cooling chamber.

14. The manufacturing method of a semiconductor device according to claim 10, wherein a plurality of baked wafers are cooled concurrently by a plurality of cooling chambers.

15. The manufacturing method of a semiconductor device according to claim 10, further comprising:
    loading the wafer having a coating film formed thereon to the bake chamber;
    carrying the wafer loaded to the bake chamber while the wafer being heated at the predetermined temperature; and
    baking the carried wafer.

16. The manufacturing method of a semiconductor device according to claim 15, wherein exhaust gas is exhausted from the bake chamber when the wafer is carried.

17. The manufacturing method of a semiconductor device according to claim 15, wherein an inside of the bake chamber is controlled to have a temperature gradient in a direction of the wafer being carried.

* * * * *